United States Patent
Renz

(10) Patent No.: US 6,894,497 B2
(45) Date of Patent: May 17, 2005

(54) MAGNETIC RESONANCE APPARATUS WITH A MOVABLE GRADIENT COIL UNIT

(75) Inventor: Wolfgang Renz, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/637,451

(22) Filed: Aug. 8, 2003

(65) Prior Publication Data
US 2004/0032263 A1 Feb. 19, 2004

(30) Foreign Application Priority Data
Aug. 19, 2002 (DE) .......................................... 102 37 874

(51) Int. Cl.$^7$ ................................................. G01V 3/00
(52) U.S. Cl. ..................................... 324/318; 324/319
(58) Field of Search ................................. 324/318, 319, 324/322, 300, 309, 307, 320

(56) References Cited

U.S. PATENT DOCUMENTS

| 5,185,576 | A | | 2/1993 | Vavrek et al. ............... 324/318 |
| 5,345,177 | A | * | 9/1994 | Sato et al. ................... 324/318 |
| 5,698,980 | A | * | 12/1997 | Sellers et al. ............... 324/318 |
| 5,783,943 | A | | 7/1998 | Mastandrea, Jr. et al. .. 324/318 |
| 5,793,210 | A | * | 8/1998 | Pla et al. ..................... 324/318 |
| 6,107,799 | A | | 8/2000 | Sellers et al. ............... 324/318 |

* cited by examiner

*Primary Examiner*—Brij B Shrivastav
(74) *Attorney, Agent, or Firm*—Schiff Hardin LLP

(57) ABSTRACT

A magnetic resonance has a scanner unit with an examination space for placing at least a region of an examination subject therein, a gradient coil unit movable in a displacement direction at least in the examination space, a component of the scanner unit surrounding the examination space, and at least one pillow that can be arranged between the gradient coil unit and the component and which has an internal pressure that can be controlled for fixing the gradient coil unit relative to the component.

17 Claims, 1 Drawing Sheet

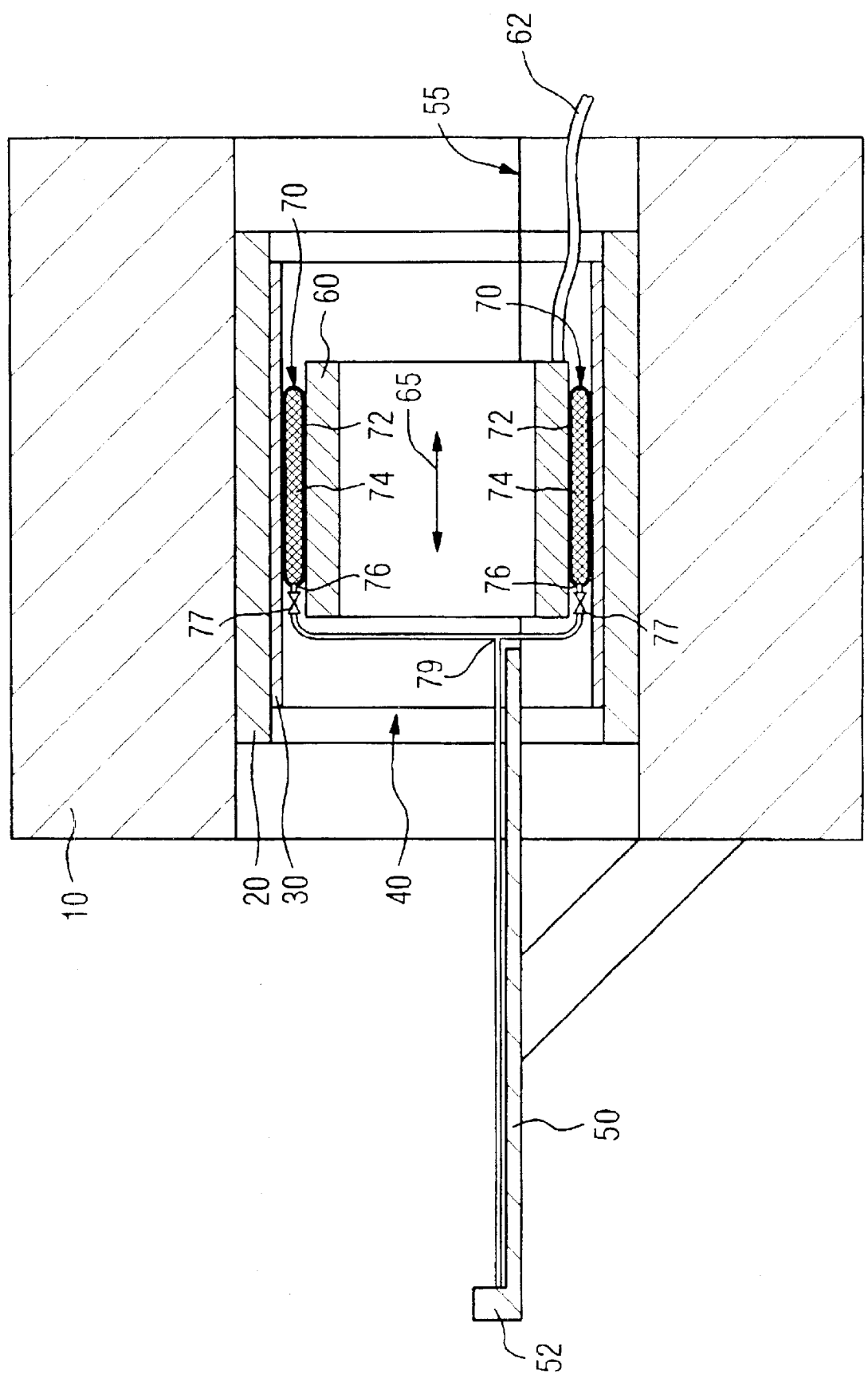

MAGNETIC RESONANCE APPARATUS WITH A MOVABLE GRADIENT COIL UNIT

BACKGROUND OF THE INVENTION

1. Field of the Invention

The invention is directed to a magnetic resonance apparatus.

2. Description of the Prior Art

Magnetic resonance technology is a known technique for, among other things, acquiring images of the inside of the body of an examination subject. In a magnetic resonance apparatus, rapidly switched gradient fields that are generated by a gradient system are superimposed on a static basic magnetic field that is generated by a basic field magnet. The magnetic resonance apparatus also has a radio-frequency system that emits radio-frequency signals into the examination subject for triggering magnetic resonance signals and that picks up the triggered magnetic resonance signals, on the basis of which magnetic resonance images are produced.

The magnetic resonance apparatus has an examination space containing an imaging volume wherein a region of the examination subject to be imaged is to be positioned for producing magnetic resonance images of that region. The positioning of the region to be imaged in the imaging volume is possible by displacement of a movable support mechanism with the examination subject placed thereon.

The gradient system of the magnetic resonance apparatus includes a gradient coil arrangement that must be rigidly connected to the basic field magnet. To that end, German OS 197 22 481 discloses a magnetic resonance apparatus wherein a basic field magnet has a first surface and a rigidly installed gradient coil system with a second surface, the two surfaces facing toward one another and being spaced from one another. A noise reduction device for damping the oscillations of the gradient coil system and/or for stiffening the gradient coil system is arranged in contact with both surfaces. In one embodiment, the noise reduction device is formed of at least one pillow. Such a pillow preferably comprises an envelope and a core or a filling. In order to achieve an especially good noise-damping effect, the pillow is elastic and/or resilient and/or flexible. In the operating state of the magnetic resonance apparatus, the pillow lies tightly against the first and the second surfaces but is not rigidly connected to these surfaces. As a result, the gradient coil system can be more easily detached for maintenance or replacement (which requires the rigid connection to be dismantled. The pillow has an air-impermeable outside skin that is formed of welded plastic film. The outside skin is composed of PVC film, polyethylene film or some other film that is airtight and weldable. A foamed fill composed of an open-pore cellular material, for example polyurethane foam, is contained in the pillow. The fill of cellular material insures good noise damping as well as providing an adequate elasticity of the pillow when the air pressure in the pillow is approximately the same as the ambient air pressure. The pillow has a connection that can be fashioned as a valve. The pillow is thicker than the distance between the first and second surfaces when the pillow is not introduced into the magnetic resonance apparatus and the valve is open. When, with the valve open, this pillow is introduced into the magnetic resonance apparatus, then the fill of cellular material presses the outside skin against the first and second surfaces, so the gap between these surfaces is completely filled. A pillow with an airtight outside skin and a fill of cellular material can be easily introduced into the gap between the first and second surfaces and be removed therefrom when the air contained in the pillow is pumped out to such an extent that it is compressed to a thinner thickness by the ambient air pressure. In an alternative embodiment of the noise reduction device, the pillow be pumped to a slight over-pressure and/or it can be filled with some other gas or a fluid and/or the inner fill of cellular material can be omitted.

In addition to a rigidly installed gradient coil system, moreover, U.S. Pat. No. 5,185,576 discloses a local gradient coil unit that is combined with a local radio-frequency antenna. The local gradient coil unit with the integrated local radio-frequency antenna is designed for a specific region of the examination subject, for example for the head of a patient. As a result, the local gradient coil unit can be implemented with smaller dimensions compared to the rigidly installed gradient coil system, yielding advantages in view of—among other things—gradient intensities that can be achieved and power demands made on the gradient amplifier that feeds the gradient coil unit. The local gradient coil unit with the integrated local radio-frequency antenna can be secured to the support mechanism such that the local gradient coil unit does not move relative to the support mechanism even during operation of the magnetic resonance apparatus despite the forces that act on it.

SUMMARY OF THE INVENTION

An object of the present invention is to provide a magnetic resonance apparatus wherein a locally introducible gradient coil unit can be flexibly fixed in the apparatus.

The object is inventively achieved by in a magnetic resonance having a scanner unit with an examination space for placing at least a region of an examination subject therein, a gradient coil unit movable in a displacement direction at least in the examination space, a component of the scanner unit surrounding the examination space, and at least one pillow that can be arranged between the gradient coil unit and the component and which has an internal pressure that can be controlled for fixing the gradient coil unit relative to the component.

The invention is based on the perception that the noise reduction device known, for example, from German OS 197 22 481 and fashioned as a pillow can also be advantageously employed in a magnetic resonance apparatus having a movable gradient coil unit (as opposed to the rigidly connected gradient coil unit with which the pillow is intended for use) for fixing such a movable gradient coil unit. The advantage of mechanical decoupling accompanied by noise reduction and reduction in the transmission of vibrations known from German OS 197 22 481 is retained, with, further advantages in conjunction with the movable gradient coil unit. Thus, the movable gradient coil unit can be remotely controlled rapidly and free of the need for actuation of a manual interlock, by means of an appropriate pump for controlling the internal pressure, allowing the movable coil unit to be fixed inside the examination space with infinite variation in the displacement direction, i.e. it can be fixed at arbitrary positions within the examination space. Fixing to what is always the same location, of course, is not precluded.

Further, the fixing by means of the pillow is advantageous because—apart from an introduction of the pillow—neither existing components of the magnetic resonance apparatus that limit the examination space nor existing, movable gradient coil units need by modified for employing this type of fixing.

In an embodiment, the pillow has an extent in the displacement direction roughly corresponding to the extent of the gradient coil unit. Particularly given a pillow that is fashioned for large-area placement and/or given utilization of a number of pillows due to the large seating surface, a high security against slippage of the gradient coil unit is achieved.

In another embodiment, the magnetic resonance apparatus has a movable support mechanism that is displaceable on a guide mechanism of the magnetic resonance apparatus, and the movable gradient coil unit is displaceable on the same guide mechanism. In one version, the examination space has at least two openings disposed opposite one another, so that the support mechanism can be moved into the examination space proceeding from one opening and the movable gradient coil unit can be moved into the examination space proceeding from the other opening. A time-efficient utilization of the magnetic resonance apparatus can be achieved as a result, since the examination subject, for example a patient, can be placed on the support mechanism during the displacement of the gradient coil unit. After the patient has been placed thereon, the support mechanism together with the patient placed thereon is moved into the examination space, where the gradient coil unit is already waiting, correctly positioned and fixed.

DESCRIPTION OF THE DRAWINGS

The single FIGURE is a side sectional view of a magnetic resonance apparatus constructed in accordance with the principles of the present invention.

DESCRIPTION OF THE PREFERRED EMBODIMENTS

As an exemplary embodiment of the invention, the FIGURE shows a longitudinal section through a magnetic resonance apparatus having a movable gradient coil unit 60 displaceable in at least one travel direction 65. The magnetic resonance apparatus has an essentially hollow-cylindrical, superconducting basic field magnet 10 for generating a static basic magnetic field. A gradient coil system 20 for generating gradient fields that is likewise essentially hollow-cylindrical is permanently installed in the cavity of the basic field magnet 10. The permanently installed gradient coil system 20 has three gradient coils, shielding coils associated with the gradient coils, cooling devices and shim devices. An essentially hollow-cylindrical whole-body antenna 30 for emitting radio-frequency signals and for receiving magnetic resonance signals is permanently installed in the control cavity of the gradient coil system 20. A central cavity of the whole-body antenna 30 essentially defines an examination space 40 in which at least a region of an examination subject, for example a patient can be placed.

A displaceable support mechanism 50 makes it possible to introduce the examination subject placed on the support mechanism 50 into the examination space 40 from the left with reference to the longitudinal section shown in the FIGURE. The support mechanism 50 is seated so as to be displaceable on a guide mechanism 55. At the foot end, the support mechanism 50, the bearing mechanism 50 has a connection unit 52 to which—among other things—a conduit of a vacuum cushion can be connected. The patient is placed in a comfortable and stable position on a sheet on the cushion. Air is then extracted from the vacuum pillow (filled with styropore balls) via the conduit, so that the shape of the vacuum pillow stabilizes.

The movable gradient coil unit 60 is displaceable at least in a part of the examination space 40. For generating gradient fields, the gradient coil unit 60 has at least one gradient coil (up to three gradient coils) and, dependent on the use requirements, shielding coils belonging to the gradient coils, cooling devices and shim devices and/or is combined with a local radio-frequency antenna. Displacement of the gradient coil unit 60 can ensue manually as well with the assistance of a motorized drive. Like the support mechanism 50, the movable gradient coil unit 60 is fashioned to be movable on the guide mechanism 55, which is unproblematical particularly given a weight of the gradient coil unit 60 that is somewhat less than an approved load weight of the support mechanism 50. Special measures have to be provided only given a weight of the gradient coil unit 60 of more than roughly 200 kg. The electrical connection lines and, if present, cooling supply lines 62 necessary for supplying the gradient coil unit 60 are conducted to the gradient coil unit 60 from the right.

A pillow 70 or multiple pillows 70 distributed in circumferential direction is/are glued to the gradient coil unit 60 for fixing the gradient coil unit 60 at an arbitrary position within the whole-body antenna 30. Each pillow 70 has a gastight outer skin 72 that is composed of two pieces of a PVC film that are welded to one another. A connection 76 fashioned with a valve 77 is introduced gastight at a location of the circumferential seam. The outer skin 72 surrounds a fill 74 of cellular material formed of an open-pore polyurethane foam that is planarly glued to the outer skin 72.

Given a displacement of the gradient coil unit 60, each pillow 70 is evacuated and each valve 77 is closed. After the gradient coil unit 80 has been positioned as desired, the valve 77 is opened for fixing the gradient coil unit 60 against the whole-body antenna, so that roughly ambient air pressure prevails in the inside of each pillow 70. The pillow 70 is dimensioned such that the outer skin 72 are pressed against the whole-body antenna 30 and the gradient coil unit 60 by the fill 74 of cellular material. The spacing between the whole-body antenna 30 and the gradient coil unit 60 is then completely filled, so that the gradient coil unit 60 is fixed and—at the same time—oscillations occurring during operation of the gradient coil unit 60 are effectively damped.

Air is pumped out of each pillow 70 via the connection 76 for rendering the gradient coil unit 60 mobile. The ambient air pressure then compresses each pillow 70, and each valve 77 is are closed so that the gradient coil unit 60 can again be moved. For the pumping, each connection 76 can be connected via a hose system 79 to the connection unit 52 at the connection point for the vacuum cushion. In a magnetic resonance apparatus that has no facilities for a vacuum cushion, a separate unit for pumping air can be connected to each pillow 70.

After setting a new position of the gradient coil unit 60 within the whole-body antenna 30, each valve 77 is again opened, so that air flows into each pillow 70. Each pillow 70 regains elasticity and thickness and thus fixes the gradient coil unit 60 in a press fit.

In an alternative embodiment each pillow 70 is pumped to a slight over-pressure and/or each pillow 70 is filled with a gas other than air or with a liquid. It is also possible to omit the inner fill 74 of cellular material.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   a magnetic resonance scanner unit having an examination space adapted to receive a region of an examination subject therein;
   a gradient coil unit movable in a displacement direction at least within the examination space;
   a movable support mechanism and a guide mechanism along which said support mechanism is movable, said gradient coil unit being movable on said guide mechanism;
   a component of the magnetic resonance scanner unit surrounding the examination space; and
   at least one pressurizable pillow disposed between the gradient coil unit and the component, said pillow having an internal pressure that is adjustable to mechanically fix the gradient coil unit relative to the component.

2. A magnetic resonance apparatus as claimed in claim 1 wherein said pillow has a thickness that is reducible, by reducing the internal pressure below ambient air pressure, to allow movement of the gradient coil unit relative to the component with the pillow disposed between the gradient coil unit and the component.

3. A magnetic resonance apparatus as claimed in claim 2 wherein said pillow is evacuatable.

4. A magnetic resonance apparatus as claimed in claim 1 wherein said pillow mechanically fixes said gradient coil unit relative to said component when the internal pressure is substantially equal to ambient air pressure.

5. A magnetic resonance apparatus as claimed in claim 1 wherein said pillow mechanically fixes said gradient coil unit relative to said component when said internal pressure is above ambient air pressure.

6. A magnetic resonance apparatus as claimed in claim 1 wherein said pillow comprises a gastight outer skin.

7. A magnetic resonance apparatus as claimed in claim 6 wherein said outer skin has a gas connection with a valve for adjusting the internal pressure.

8. A magnetic resonance apparatus as claimed in claim 1 wherein said pillow is at least partially filled with material selected from the group consisting of at least one of a gas, a foam, a cellular material and a liquid.

9. A magnetic resonance apparatus as claimed in claim 1 wherein said pillow has an extent in said displacement direction substantially equally to an extent of the gradient coil unit in the displacement direction.

10. A magnetic resonance apparatus as claimed in claim 1 wherein said pillow is connected to said gradient coil unit.

11. A magnetic resonance apparatus as claimed in claim 10 wherein said pillow is glued to said gradient coil unit.

12. A magnetic resonance apparatus as claimed in claim 1 wherein said component has a shape allowing said gradient coil unit to be fixed against said component.

13. A magnetic resonance apparatus as claimed in claim 1 wherein said component comprises a whole-body antenna.

14. A magnetic resonance apparatus as claimed in claim 1 comprising a control unit connected to said pillow for adjusting the internal pressure.

15. A magnetic resonance apparatus as claimed in claim 1 wherein said component cylindrically limits said examination space.

16. A magnetic resonance apparatus as claimed in claim 15 wherein said gradient coil has a hollow-cylindrical shape.

17. A magnetic resonance apparatus comprising:
    a magnetic resonance scanner unit having an examination space adapted to receive a region of an examination subject therein said examination space having at least two openings disposed opposite each other;
    a gradient coil unit movable in a displacement direction at least within the examination space;
    a movable support system movable into the examination space from a first of said openings, and said gradient coil unit being movable into the examination space from a second of said openings;
    a component of the magnetic resonance scanner unit surrounding the examination space; and
    at least one pressurizable pillow disposed between the gradient coil unit and the component, said pillow having an internal pressure that is adjustable to mechanically fix the gradient coil unit relative to the component.

* * * * *